(12) United States Patent
Buchberger, Jr. et al.

(10) Patent No.: US 11,934,103 B2
(45) Date of Patent: Mar. 19, 2024

(54) APPARATUS FOR POST EXPOSURE BAKE OF PHOTORESIST

(71) Applicant: Applied Materials, Inc., Santa Clara, CA (US)

(72) Inventors: Douglas A. Buchberger, Jr., Livermore, CA (US); Dmitry Lubomirsky, Cupertino, CA (US); John O. Dukovic, Palo Alto, CA (US); Srinivas D. Nemani, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 208 days.

(21) Appl. No.: 17/668,080

(22) Filed: Feb. 9, 2022

(65) Prior Publication Data
US 2022/0269180 A1    Aug. 25, 2022

Related U.S. Application Data (63) Continuation of application No. PCT/US2022/015146, filed on Feb. 3, 2022, which is (Continued)

(51) Int. Cl.
*G03F 7/38* (2006.01)

(52) U.S. Cl.
CPC .................................... *G03F 7/38* (2013.01)

(58) Field of Classification Search
CPC ... G03F 7/38; G03F 7/2041; H01L 21/67017; H01L 21/67069; H01L 21/67075; H01L 21/67225
See application file for complete search history.

(56) References Cited

U.S. PATENT DOCUMENTS

| 6,686,132 B2 | 2/2004 | Cheng et al. |
| 6,841,342 B2 | 1/2005 | Nishi et al. |

(Continued)

FOREIGN PATENT DOCUMENTS

| CN | 100541330 C | 9/2009 |
| JP | 2005123651 A | 5/2005 |

(Continued)

OTHER PUBLICATIONS

International Search Report and Written Opinion dated May 18, 2022 for Application No. PCT/US2022/015146.

(Continued)

*Primary Examiner* — Hung V Nguyen
(74) *Attorney, Agent, or Firm* — Patterson + Sheridan, LLP (57) ABSTRACT

A method and apparatus for applying an electric field and/or a magnetic field to a photoresist layer without air gap intervention during photolithography processes is provided herein. The method and apparatus include a transfer device and a plurality of modules. The transfer device is configured to rotate a plurality of substrates between each of the modules, wherein one module includes a heating pedestal and another module includes a cooling pedestal. One module is utilized for inserting and removing the substrates from the system. At least the heating module is able to be sealed and filled with a process volume before applying the electric field.

20 Claims, 9 Drawing Sheets

Related U.S. Application Data a continuation of application No. 17/176,108, filed on Feb. 15, 2021, now Pat. No. 11,815,816.

(60) Provisional application No. 63/149,618, filed on Feb. 15, 2021, provisional application No. 63/149,617, filed on Feb. 15, 2021.

(56) References Cited

U.S. PATENT DOCUMENTS

| | | | |
|---|---|---|---|
| 7,341,939 | B2 | 3/2008 | Oweyang et al. |
| 7,402,782 | B2 | 7/2008 | Iwaki |
| 8,097,402 | B2 | 1/2012 | Scheer et al. |
| 8,097,492 | B2 | 1/2012 | Magerlein et al. |
| 8,288,174 | B1 | 10/2012 | Rathsack et al. |
| 8,343,371 | B2 | 1/2013 | Funk et al. |
| 9,482,953 | B2 | 11/2016 | Koh et al. |
| 9,829,790 | B2 | 11/2017 | Buchberger, Jr. et al. |
| 9,958,782 | B2 | 5/2018 | Hanson et al. |
| 10,203,604 | B2 | 2/2019 | Babayan et al. |
| 10,474,033 | B2 | 11/2019 | Babayan et al. |
| 10,656,526 | B2 | 5/2020 | Sano et al. |
| 10,795,262 | B2 | 10/2020 | Park et al. |
| 11,262,662 | B2 * | 3/2022 | Babayan ............ H01L 21/67109 |
| 11,550,224 | B2 * | 1/2023 | Hanson ................... C23C 16/56 |
| 2002/0123011 | A1 | 9/2002 | Kawano et al. |
| 2007/0105043 | A1 | 5/2007 | Elian et al. |
| 2010/0081285 | A1 | 4/2010 | Chen et al. |
| 2011/0177694 | A1 | 7/2011 | Chen et al. |
| 2015/0355549 | A1 | 12/2015 | Xie et al. |
| 2016/0011526 | A1 | 1/2016 | Xie et al. |
| 2016/0357107 | A1 | 12/2016 | Buchberger, Jr. et al. |
| 2018/0308669 | A1 | 10/2018 | Bokka et al. |
| 2019/0006216 | A1 | 1/2019 | Lau et al. |
| 2019/0187563 | A1 | 6/2019 | Babayan et al. |
| 2019/0287792 | A1 | 9/2019 | Park et al. |
| 2019/0369499 | A1 | 12/2019 | Lai et al. |
| 2020/0201196 | A1 | 6/2020 | Ronde et al. |
| 2020/0387074 | A1 | 12/2020 | Hanson et al. |
| 2022/0269179 | A1 * | 8/2022 | Buchberger, Jr. ..... G03F 7/2041 |

FOREIGN PATENT DOCUMENTS

| | | |
|---|---|---|
| JP | 2006030506 A | 2/2006 |
| JP | 4251830 B2 | 4/2009 |
| KR | 10-2003-0053328 A | 6/2003 |
| WO | 2007045498 A2 | 4/2007 |
| WO | 2009101869 A1 | 8/2009 |
| WO | 2021/011166 A1 | 1/2021 |

OTHER PUBLICATIONS

Theodore Manouras et al., "High Sensitivity Resists for EUV Lithography: A Review of Material Design Strategies and Performance Results", Nanomaterials 2020.

International Search Report and Written Opinion dated Mar. 10, 2022 for Application No. PCT/US2021/059552.

* cited by examiner

FIG. 6

APPARATUS FOR POST EXPOSURE BAKE OF PHOTORESIST

CROSS-REFERENCE TO RELATED APPLICATIONS

This application claims benefit of U.S. provisional patent application Ser. No. 63/149,618, filed Feb. 15, 2021, which is herein incorporated by reference in its entirety. This application further claims benefit of International Application (PCT) serial number PCT/US2022/015146, filed Feb. 3, 2022, which claims priority to each of U.S. non-provisional patent application Ser. No. 17/176,108; U.S. provisional patent application Ser. No. 63/149,617; and U.S. provisional patent application Ser. No. 63/149,618, each filed on Feb. 15, 2021.

BACKGROUND

Field

The present disclosure generally relates to methods and apparatus for processing a substrate, and more specifically to methods and apparatus for improving photolithography processes.

Description of the Related Art

Integrated circuits have evolved into complex devices that can include millions of components (e.g., transistors, capacitors and resistors) on a single chip. Photolithography is a process that may be used to form components on a chip. Generally the process of photolithography involves a few basic stages. Initially, a photoresist layer is formed on a substrate. A chemically amplified photoresist may include a resist resin and a photoacid generator. The photoacid generator, upon exposure to electromagnetic radiation in the subsequent exposure stage, alters the solubility of the photoresist in the development process. The electromagnetic radiation may have any suitable wavelength, for example, a 193 nm ArF laser, an electron beam, an ion beam, or other suitable source.

In an exposure stage, a photomask or reticle may be used to selectively expose certain regions of the substrate to electromagnetic radiation. Other exposure methods may be maskless exposure methods. Exposure to light may decompose the photo acid generator, which generates acid and results in a latent acid image in the resist resin. After exposure, the substrate may be heated in a post-exposure bake process. During the post-exposure bake process, the acid generated by the photoacid generator reacts with the resist resin, changing the solubility of the resist during the subsequent development process.

After the post-exposure bake, the substrate, particularly the photoresist layer, is developed and rinsed. Depending on the type of photoresist used, regions of the substrate that were exposed to electromagnetic radiation are either resistant to removal or more prone to removal. After development and rinsing, the pattern of the mask is transferred to the substrate using a wet or dry etch process.

The evolution of chip design continually requires faster circuitry and greater circuit density. The demands for greater circuit density necessitate a reduction in the dimensions of the integrated circuit components. As the dimensions of the integrated circuit components are reduced, more elements are required to be placed in a given area on a semiconductor integrated circuit. Accordingly, the lithography process must transfer even smaller features onto a substrate, and lithography must do so precisely, accurately, and without damage. In order to precisely and accurately transfer features onto a substrate, high resolution lithography may use a light source that provides radiation at small wavelengths. Small wavelengths help to reduce the minimum printable size on a substrate or wafer. However, small wavelength lithography suffers from problems, such as low throughput, increased line edge roughness, and/or decreased resist sensitivity.

An electrode assembly may be utilized to generate an electric field to a photoresist layer disposed on the substrate prior to or after an exposure process so as to modify chemical properties of a portion of the photoresist layer where the electromagnetic radiation is transmitted for improving lithography exposure/development resolution. However, the challenges in implementing such systems have not yet been adequately overcome.

Therefore, there is a need for improved methods and apparatus for improving immersion field guided post exposure bake processes.

SUMMARY

The present disclosure generally relates to substrate process apparatus. Specifically, embodiments of the disclosure relate to an immersion lithography carousel assembly. The immersion lithography carousel assembly includes a first module, a second module, a third module, and a transfer device. The first module includes a lift surface and a plurality of lift pins. The second module includes a heating pedestal, a second module hood forming a second module process volume between the heating pedestal and the second module hood, and an electrode. The third module includes a cooling pedestal and a third module hood forming a third module process volume between the cooling pedestal and the third module hood. The transfer device includes a plurality of openings. The transfer device is rotatable to position a first opening selectively over the lift surface, the heating pedestal, and the cooling pedestal.

In another embodiment, an immersion lithography carousel assembly includes a first module, a second module, a third module, and a carousel assembly. The first module includes a lift surface and a plurality of lift pins holders. The second module includes a heating pedestal, a second module hood forming a second module process volume between the heating pedestal and the second module hood, and an electrode coupled to the second module hood. The third module includes a cooling pedestal and a third module hood forming a third module process volume between the cooling pedestal and the third module hood. The carousel assembly includes a plurality of pedestal openings disposed therethrough. Each of the plurality of pedestal openings are configured to actuate over each of the lift surface, the heating pedestal, and the cooling pedestal and each of the heating pedestal and the cooling pedestal are operable to at least partially pass through the plurality of pedestal openings.

A method of performing a post-exposure bake process is also described. The method includes loading a substrate onto a carousel at a first station, transferring the substrate from the first station to a second station on the carousel, and raising a heating pedestal of the second station to contact a backside of the substrate at a process position. After raising the heating pedestal the substrate is heated using the heating pedestal and a second module process volume is filled with a process fluid. The second module process volume is disposed between the heating pedestal and a hood of an electrode assembly. An electric field is applied to the substrate using an electrode disposed within the electrode assembly after filling the second module process volume with the process fluid. The heating pedestal is lowered to a transfer position and the substrate is transferred from the second station to a third station on the carousel. A cooling pedestal of the third station is raised to contact a backside of the substrate at a cooling position. The substrate is cooled using the cooling pedestal and the cooling pedestal is lowered to the transfer position.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to methods and apparatus for post exposure bake processes. Methods and apparatus disclosed herein assist in reducing line edge/width roughness and improving exposure resolution in a photolithography process for semiconductor application.

The methods and apparatus disclosed herein improve the photoresist sensitivity and productivity of photolithography processes. The random diffusion of charged species generated by a photoacid generator during a post exposure bake procedure contributes to line edge/width roughness and reduced resist sensitivity. An electrode assembly, such as those described herein, is utilized to apply an electric field and/or a magnetic field to the photoresist layer during photolithography processes. The field application controls the diffusion of the charged species generated by the photoacid generator. Furthermore, an intermediate medium is utilized between the photoresist layer and the electrode assembly so as to enhance the electric field generated therebetween.

An air gap defined between the photoresist layer and the electrode assembly results in voltage drop applied to the electrode assembly, thus, adversely lowering the level of the electric field desired to be generated across the photoresist layer. Inaccurate levels of the electric field at the photoresist layer may result in insufficient or inaccurate voltage power to drive or create charged species in the photoresist layer in certain desired directions, thus leading to diminished line edge profile control to the photoresist layer. Thus, an intermediate medium is placed between the photoresist layer and the electrode assembly to prevent an air gap from being created therebetween so as to maintain the level of the electric field interacting with the photoresist layer at a certain desired level. By doing so, the charged species generated by the electric field are guided in a desired direction along the line and spacing direction, substantially preventing the line edge/width roughness that results from inaccurate and random diffusion. Thus, a controlled or desired level of electric field as generated increases the accuracy and sensitivity of the photoresist layer to expose and/or development processes. In one example, the intermediate medium is a non-gas phase medium, such as a slurry, gel, liquid solution, or a solid state medium that may efficiently maintain voltage levels as applied at a determined range when transmitting from the electrode assembly to the photoresist layer disposed on the substrate.

Even while using the intermediate medium, a voltage drop is still present between the photoresist layer and the electrode assembly. This voltage drop is directly related to the distance between the photoresist layer and the electrode assembly. Therefore, reducing the distance between the photoresist layer and the electrode assembly assists in improving the uniformity of the electric field between the photoresist layer and the electrode assembly. Another consideration while using the intermediate medium is bubbling between the photoresist layer and the electrode assembly. Bubbling and the formation of air pockets between the photoresist layer and the electrode assembly causes non-uniformities within the electric field and therefore increases the number of defects and inaccuracies within the photoresist after the post-exposure bake process. The present apparatus and methods described herein for reducing the distance between the photoresist and the electrode assembly beneficially reduces the number of bubbles or air pockets between the photoresist layer and the electrode assembly.

Figure 1:
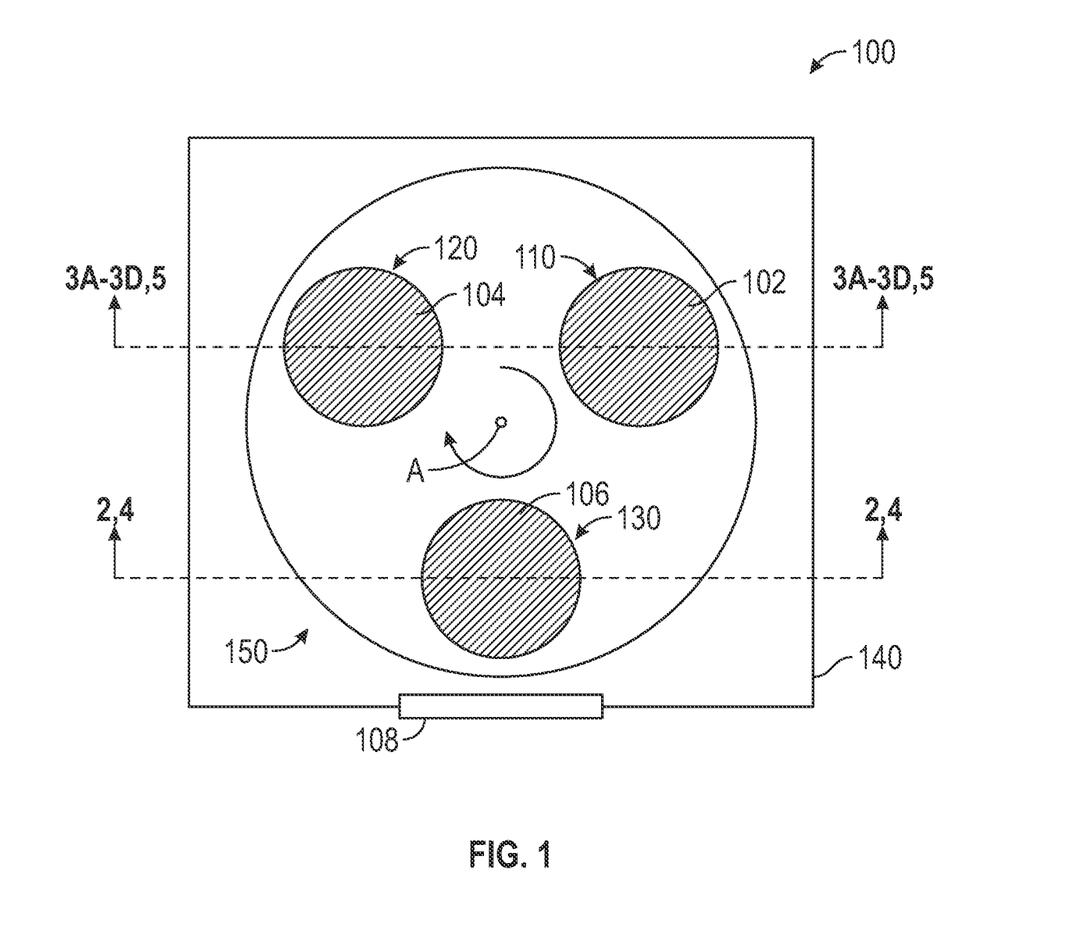
FIG. 1 is a schematic plan view of an immersion lithography carousel assembly according to embodiments described herein.

FIG. 1 is a schematic plan view of an immersion lithography carousel assembly 100 according to embodiments described herein. The immersion lithography carousel assembly 100 includes a transfer device 150, a first module 130, a second module 120, and a third module 110. Each of the first module 130, the second module 120, and the third module 110 are evenly distributed about a central axis A of the carousel assembly 100. A top of the first module 130 is formed by a first module hood 106. A top of the second module 120 is formed by a second module hood 104. A top of the third module 110 is formed by a third module hood 102.

Each of the transfer device 150, the first module 130, the second module 120, and the third module 110 are disposed within a unit body 140. The unit body 140 surrounds the transfer device 150, the first module 130, the second module 120, and the third module 110 to prevent outside atmosphere from entering any of the first module 130, the second module 120, and the third module 110. A substrate transfer passage 108 is formed through the unit body 140. The substrate transfer passage 108 is coupled with a valve (not shown) for opening and closing the substrate transfer passage 108. Substrates are transferred into and out of the unit body 140 through the substrate transfer passage 108.

The substrate transfer passage 108 is horizontally elongated to allow substrates to pass through the substrate transfer passage 108 in a horizontal orientation. The substrate transfer passage 108 connects the volume within the unit body 140 with an outside volume of another module or a process chamber. The substrate transfer passage 108 is disposed adjacent to the first module 130, as the substrate is configured to be picked up from and deposited onto the first module by a robot arm or indexer (not shown) to pass the substrate through the substrate transfer passage 108 when the valve is open. The substrate transfer passage 108 is closer to the first module 130 than either of the second module 120 and the third module 110. The second module 120 is configured to heat the substrate and apply an electric field to perform a post-exposure bake process. The third module 110 is configured to cool the substrate after the post-exposure bake process. Each of the first module 130, the second module 120, and the third module 110 are described below in greater detail.

The transfer device 150 is shown as a disk with a plurality of pedestal openings disposed therethrough. However, the transfer device may have alternative configurations. The transfer device 150 is a carousel assembly and is configured to rotate a plurality of substrates around the axis A, thus transferring the substrates between each of the first module 130, the second module 120, and the third module 110.

Figure 2:
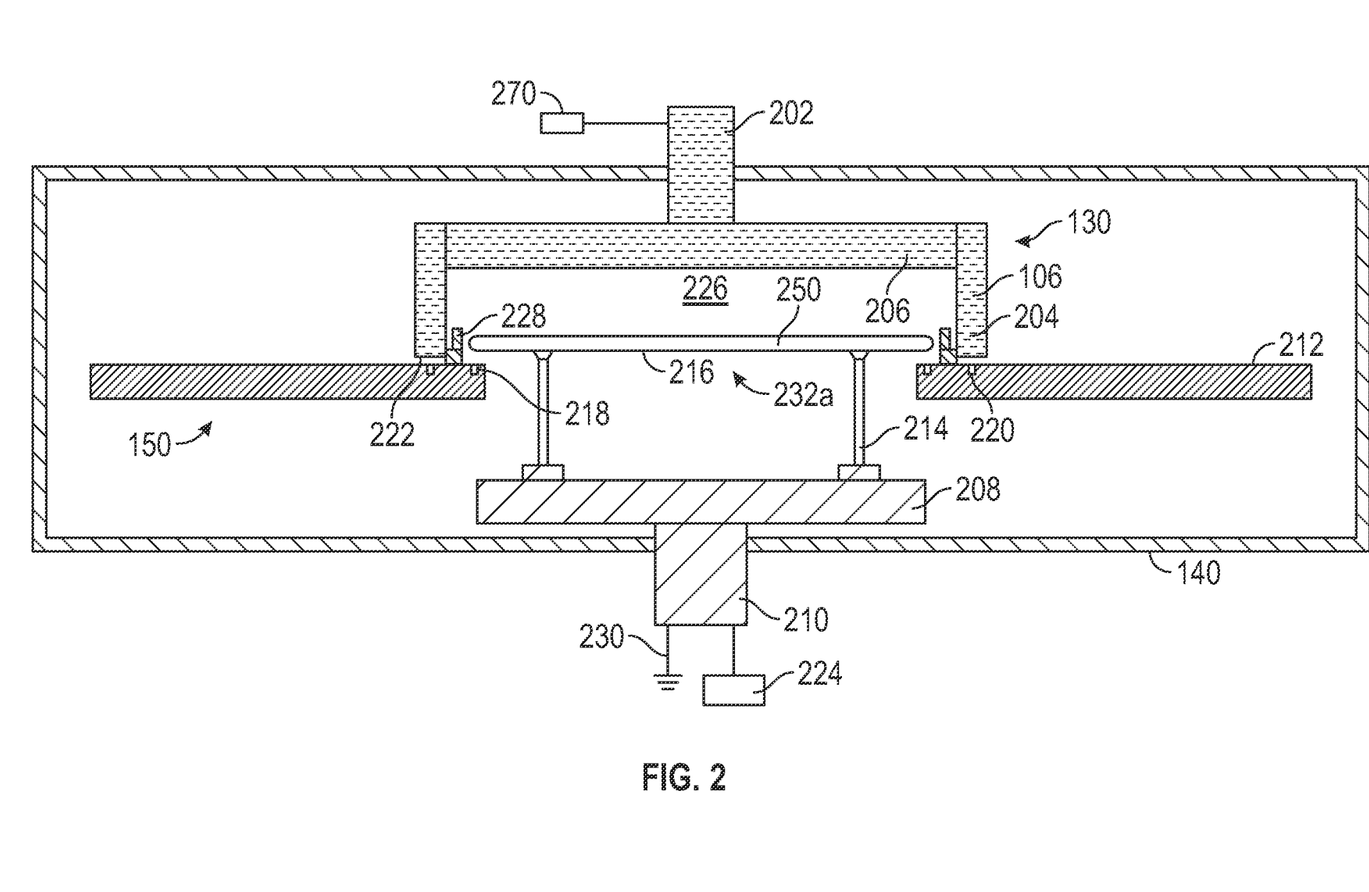
FIG. 2 is a schematic cross-sectional view of a first module of the immersion lithography carousel assembly of FIG. 1 according to an embodiment described herein.

FIG. 2 is a schematic cross-sectional view of a first module 130 of the immersion lithography carousel assembly 100 of FIG. 1. The first module 130 includes a plurality of lift pins 214 disposed on top of a lift assembly 208. The lift assembly 208 is disposed below the transfer device 150. A first module hood 106 is disposed over the transfer device 150 and forms an upper portion of the first module 130. The first module hood 106 is shown aligned with a first pedestal opening 232a of a plurality of pedestal openings 232a, 232b, 232c disposed through the transfer device 150. Each of the pedestal openings 232a, 232b, 232c are similar in size and shape. Each of the pedestal openings 232a, 232b, 232c are configured to allow pedestals, such as those described herein to pass therethrough.

The transfer device 150 further includes an inner sealing groove 218 and an outer sealing groove 220 disposed about the pedestal openings 232a, 232b, 232c. The inner sealing groove 218 is an annular groove formed in the top surface 212 of the transfer device 150 and around each of the pedestal openings 232a, 232b, 232c. The inner sealing groove 218 is sized to receive an annular seal ring, such as an o-ring, and contact a bottom surface 216 of a substrate 250. The seal ring disposed in the inner sealing groove 218 is configured to form a seal between the substrate 250 and the top surface 212 of the transfer device 150. The seal enables a first module process volume 226 to be formed above the substrate 250 without gas or fluid from the first module process volume 226 interacting with a volume below the substrate 250.

Figure 3A:
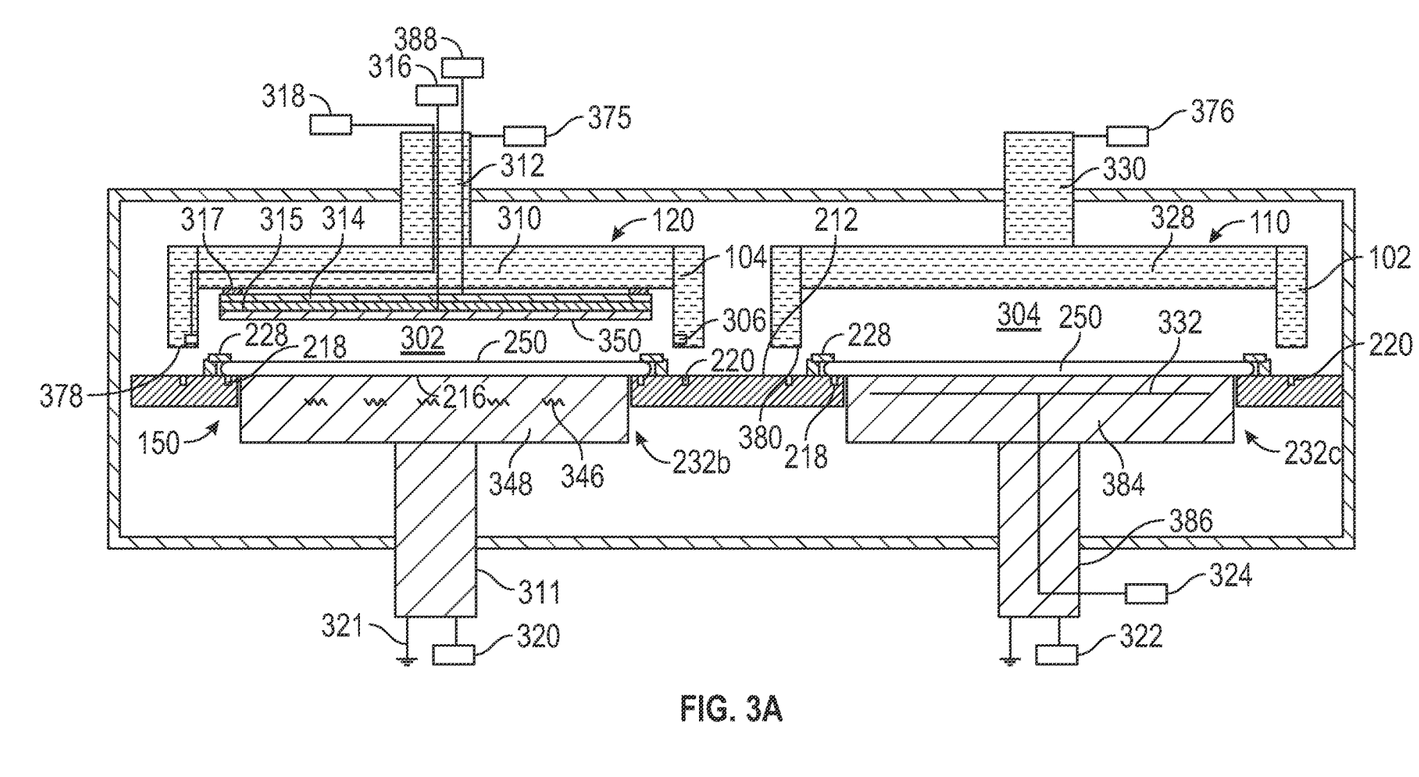
FIGS. 3A-3D are schematic cross-sectional views of a second module and a third module of the immersion lithography carousel assembly of FIG. 1 according to an embodiment described herein.

To assist in forming the seal between the substrate 250 and the transfer device 150, one or more clamps 228 are disposed around the pedestal openings 232a, 232b, 232c and radially outside of the inner sealing groove 218. The one or more clamps 228 are shown herein as mechanical clamps, such that the clamps 228 move between an opened and a closed position. The clamps 228 are in an open position when not in contact with the substrate 250 and are in a closed position when contacting the top surface of the substrate 250 (as shown in FIGS. 2 and 3A respectively). The one or more clamps 228 are attached to the top surface 212 of the transfer device 150. The one or more clamps 228 are configured to clamp an edge of the substrate 250 to assist in supporting the substrate 250 and hold the substrate 250 in place during the post-exposure bake operations. The clamps 228 may also be vacuum clamps in some embodiments, such that the substrate 250 is clamped to the top surface 212 of the transfer device 150 using a plurality of vacuum openings (not shown) disposed around the edge of the substrate 250 at a position radially inward of the inner sealing groove 218. The plurality of vacuum openings would be coupled to a vacuum pump (not shown) and configured to apply a suction force to the bottom side of the substrate 250. Mechanical clamps are used herein as mechanical clamping may clamp either the side or top surface of the substrate 250 and a process gas or process fluid is kept from leaking from the process volume above the substrate 250. Mechanical clamps are also beneficial in that they do not produce an electric field and the effectiveness of the mechanical clamp is not impacted by the use of liquids or slurries. In some embodiments, there are three or more clamps 228 when using a mechanical clamp.

Each of the plurality of outer sealing groove 220 is disposed around one of the inner sealing groove 218, such that the outer sealing groove 220 are concentric with the inner sealing groove 218. The outer sealing groove 220 are disposed about the pedestal openings 232a, 232b, 232c. The outer sealing groove 220 is an annular groove formed in the top surface 212 of the transfer device 150 and around each of the pedestal openings 232a, 232b, 232c. The outer sealing groove 220 is sized to receive an annular sealing ring, such as an o-ring, and contact a bottom surface of one of the first module hood 106, the second module hood 104, and the third module hood 102. The realing ring disposed in the outer sealing groove 220 is configured to form a seal between the top surface 212 of the transfer device 150 and the bottom surface 222 of one of the first module hood 106, the second module hood 104 (bottom surface 378), and the third module hood 102 (bottom surface 280). As described herein, the sealing ring is a seal which includes o-ring seals, quad seals, cup seals, square gaskets, etc. The seal enables a first module process volume 226 to be formed above the substrate 250 without gas or fluid from the first module process volume 226 interacting with a volume outside of the first module hood 106.

The first module hood 106 is disposed above the transfer device 150 and forms an upper portion of the first module 130. The first module hood 106 is shaped to form a first module process volume 226. The first module hood 106 includes a body 206 disposed over the substrate 250 and one of the pedestal openings 232a, 232b, 232c. The body 206 is cylindrical and includes sidewalls 204 further defining the first module process volume 226. The body 206 is coupled to a shaft 202, which is disposed through the walls of the unit body 140. The first module hood 106 is coupled to a first hood actuator 270. The first hood actuator 270 is configured to raise and lower the first module hood 106 to enable placement of the substrate 250 within the first module process volume 226 and onto the lift pins 214. The bottom surface 222 is disposed at the bottom of the sidewalls 204, such that the first module hood 106 forms a hollow half-cylinder. Other effective shapes of the first module hood 106 are contemplated. The first module hood 106 is formed of a conductive material with a resistivity of less than about $5 \times 10^{-4}$ Ω·m, such as less than $5 \times 10^{-5}$ Ω·m, such as less than $5 \times 10^{-6}$ Ω·m. In some embodiments, the body of the first module hood 106 is formed of a metal, a metal alloy, or a silicon carbide material. Each of the second module hood 104 and the third module hood 102 may be a similar material to the first module hood 106. Either of the second module hood 104 and/or the third module hood 102 are formed of a material with a resistivity of less than about $5 \times 10^{-4}$ Ω·m, such as less than $5 \times 10^{-5}$ Ω·m, such as less than $5 \times 10^{-6}$ Ω·m.

The lift assembly 208 is disposed below the transfer device 150 and forms a lower portion of the first module 130. The lift assembly 208 includes the plurality of lift pins 214 disposed thereon and configured to contact the bottom surface 216 of the substrate 250. The lift pins 214 are disposed either on top of or partially through the body of the lift assembly 208. The lift assembly 208 includes a shaft 210 coupled thereto. The shaft 210 is disposed through a bottom wall of the unit body 140. The lift assembly 208 is coupled to an actuator 224 and ground line 230. The actuator 224 is configured to raise and lower the lift assembly 208 and the lift pins 214 between a receiving position, where the lift pins 214 receive the substrate 250 as shown in FIG. 2, and a transfer position, wherein the substrate 250 is disposed on the top surface 212 of the transfer device 150. The lift assembly 208 is grounded by the ground line 230.

FIGS. 3A-3D are schematic cross-sectional views of a second module 120 and a third module 110 of the immersion lithography carousel assembly 100 of FIG. 1 according to an embodiment described herein. The second module 120 includes the second module hood 104 and the third module 110 includes the third module hood 102. The second module hood 104 includes a second module body 310. The second module body 310 and the third module body 328 are similar in shape to the body 206 of the first module hood 106.

As shown in FIGS. 3A-3D, each of the pedestal openings 232a, 232b, 232c is surrounded by separate inner sealing grooves 218, one or more clamps 228, and separate outer sealing grooves 220. As shown herein, each of the pedestal openings 232a, 232b, 232c is sized to allow a heating pedestal 348 and a cooling pedestal 384 to pass therethrough and contact the bottom surface 216 of the substrate 250.

Figure 3B:
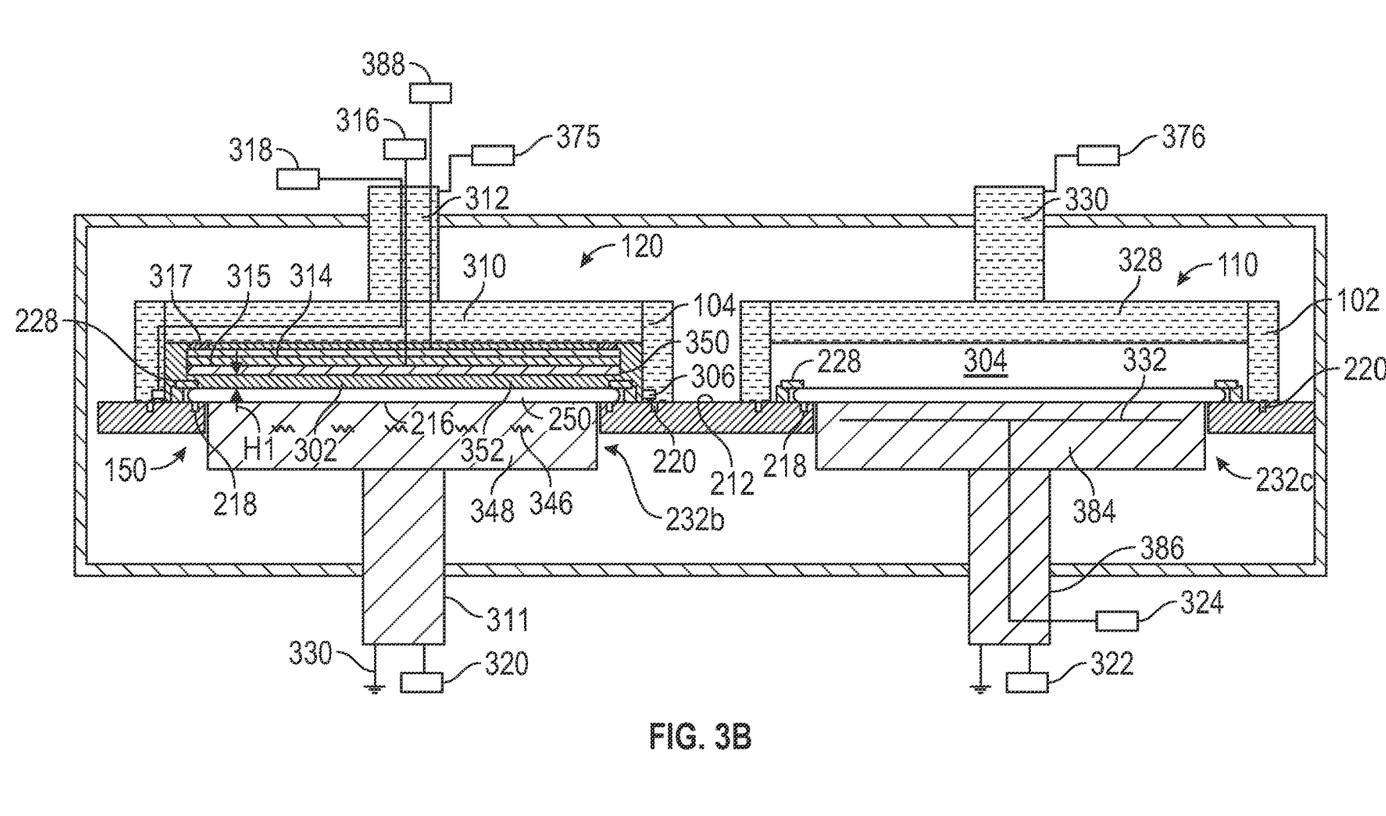

As shown herein, the second module 120 includes the second module hood 104, an electrode 350, and the heating pedestal 348. The electrode 350 is coupled to the second module hood 104. A second module process volume 302 is disposed between the second module hood 104 and the substrate 250 when the substrate is sealed to the transfer device 150 and the bottom surface 278 of the second module hood 104 is sealed to the top surface 212 of the transfer device 150 as shown in FIG. 3B. The heating pedestal 348 is raised to contact and heat the substrate 250.

The second module hood 104 includes one or more fluid inlets 306 disposed therein. The one or more fluid inlets 306 are disposed on the inner sidewalls of the second module body 310. The one or more fluid inlets 306 are coupled to a fluid supply 318 by a conduit. The fluid supply 318 is configured to provide process fluid to the second module process volume 302 through the one or more fluid inlets 306. The process fluid is an intermediate medium used to improve the uniformity of the electric field between the electrode 350 and the substrate 250 during post exposure bake operations. The process fluid is a non-gas phase medium, such as a slurry, gel, liquid solution, or a solid state medium that may efficiently maintain voltage levels as applied at a determined range when transmitting from the electrode assembly to the photoresist layer disposed on the substrate. In some embodiments, there are a plurality of fluid inlets disposed around the inner edge of the second module body 310.

The electrode 350 coupled to the second module hood 104 is disposed parallel to the substrate 250 and the top surface of the heating pedestal 348. The electrode 350 is permeable to allow fluid to pass therethrough. For example the electrode 1250 includes one or a combination of perforations, mesh, pores, or other fluid permeable structures. The electrode 350 includes a plurality of fine openings disposed therethrough to allow either gas, process fluid, or both gas and process fluid to pass therethrough. In some embodiments, the electrode 350 is a conductive mesh. The electrode 350 is utilized in order to reduce the amount of bubbles or gas pockets which are trapped under the electrode 350 as the electrode 350 is submerged into the process fluid. The electrode 350 in some embodiments, is a non-metal mesh, such as a silicon carbide mesh, such as a doped silicon carbide. In other embodiments, the electrode 350 is a conductive metal mesh, such as a copper, aluminum, platinum, or a steel mesh. The electrode 350 is electrically coupled to an electrode power source 316. The electrode power source 316 is configured to apply power to the electrode 350. In some embodiments, an electrical potential of up to 5000 V is applied to the electrode 350 by the electrode power source 316, such as less than 4000 V, such as less than 3000 V. The electrode 350 is formed of a material with an electrical resistivity of less than about $5 \times 10^{-4}$ Ω·m, such as less than $5 \times 10^{-5}$ Ω·m, such as less than $5 \times 10^{-6}$ Ω·m.

A monitor electrode 314 and the spacer 315 are disposed above the electrode 350. The monitor electrode 314 is oriented parallel to the electrode 350. The monitor electrode 314 may have a similar size and shape as the electrode 350. The monitor electrode 314 is fabricated from a material different than that of the electrode 350. The monitor electrode 314 is electrically coupled to a second power source 388. The second power source 388 is similar to the electrode power source 316 and is configured to apply power to the monitor electrode 314. In some embodiments, an electrical potential of up to 5000 V is applied by the second power source 388 to the monitor electrode 314 by the second power source 388, such as less than 4000 V, such as less than 3000 V. The monitor electrode 314 is spaced from the electrode 350 and enables a user or a controller to monitor the electric field of the electrode 350. Monitoring the electric field of the electrode 350 allows for discrepancies within the electric field to be analyzed during substrate processing. The discrepancies may be caused by either bubbling or the changing of process fluid characteristics throughout the process. The monitor electrode 314 provides a constant source of feedback which can be used to assess the electric field being applied to the substrate 250 through the process fluid. The monitor electrode 314 is a permeable electrode, such as a perforated electrode or a conductive mesh. The monitor electrode 314 is configured to allow bubbles to pass therethrough.

The spacer 315 is disposed between the monitor electrode 314 and the electrode 350. The spacer 315 is an insulating material, such as a ceramic material. In embodiments described herein, the spacer 315 is a disk disposed between the electrode 350 and the monitor electrode 314 that reduces the influence of the monitor electrode 314 on the electric field produced by the electrode 350 during substrate processing. The spacer 315 is permeable in a similar manner as the monitor electrode 314 and/or the electrode 350. The spacer 315 includes a plurality of passages disposed therein to allow bubbles and process fluid to pass therethrough. The diameter of the spacer 315 is similar to or larger than the diameter of the electrode 350 and the monitor electrode 314. In some embodiments the spacer 315 is connected to a top surface of the electrode 350 and a bottom surface of the monitor electrode 314. A small gap is left between the electrode 350 and the lower surface of the central portion of the second module body 310. The monitor electrode 314 is additionally spaced from the lower surface of the central portion of the second module body 310. The electrode 350 and the monitor electrode 314 are spaced to allow bubbles to pass through the electrode 350 and the monitor electrode 314 before collecting above the electrode 350 and the monitor electrode 314. The impact of the bubbles on the electric field produced by the electrode 350 between the electrode 350 and the substrate 250 is reduced when not disposed between the electrode 350 and the substrate 250.

One or more electrical isolators 317 separate the electrode 350 and the second module body 310. The one or more electrical isolators 317 have an electrical conductivity of greater than about $10 \times 10^{19}$ Ω·m, such as greater than about $10 \times 10^{20}$ Ω·m. In some embodiments, the electrical isolators 317 are a polytetrafluoroethylene (PTFE) or fluoropolymer material. The electrical isolators 317 are configured to separate the electrode 350 as well as the monitor electrode 314 and the spacer 315 from the second module body 310, so that the electrode 350, and the monitor electrode 314 are electrically isolated from the second module body 310.

The second module hood 104 is coupled to a second hood shaft 312. The second hood shaft is disposed through a top wall of the unit body 140. A second hood actuator 375 is coupled to the second module hood 104. The second hood actuator 375 is configured to raise and lower the second module hood 104 to enable the transfer device 150 to transfer the substrate 250 into the second module process volume 302 and below the electrode 350. The bottom surface 378 of the second module body 310 is disposed at the bottom of the sidewalls of the second module body 310 and is configured to form a sealed volume when contacting the outer sealing groove 220.

The heating pedestal 348 includes a pedestal body with one or more heating elements 346 disposed therein. The one or more heating elements 346 may be resistive heating elements, heated pipes, or a lamp assembly. As shown in FIGS. 3A-3D, the one or more heating elements 346 are resistive heating elements. The one or more heating elements 346 are coupled to a heating power source (not shown) by a power line (not shown). The heating elements 346 are configured to raise the temperature of the substrate 250 to a temperature of about 80° C. to about 250° C., such as about 90° C. to about 230° C., such as about 90° C. to about 130° C.

The heating pedestal 348 is a highly conductive material, with an electrical resistivity of less than about $5 \times 10^{-4}$ Ω·m, such as less than $5 \times 10^{-5}$ Ω·m, such as less than $5 \times 10^{-6}$ Ω·m. In some embodiments, the heating pedestal 348 is an aluminum, a doped silicon carbide, or a dopes silicon material. The heating pedestal 348 is grounded by a ground line 321.

A top surface of the heating pedestal 348 is configured to receive a substrate, such as the substrate 250. The top surface is planar and is a substrate receiving surface. The top surface is configured to contact the substrate 250 and ground the substrate 250 during application of an electric field. A heating pedestal shaft 311 is coupled to the bottom of the heating pedestal 348 and is disposed through the bottom wall of the unit body 140. The heating pedestal 348 is further coupled to a heating pedestal actuator 320. The heating pedestal actuator 320 is configured to raise and lower the heating pedestal 348 through the pedestal openings.

The third module 110 includes the third module hood 102 and the cooling pedestal 384. The third module hood 102 forms an upper portion of the third module 110 and is disposed above the transfer device 150, while the cooling pedestal 384 forms a lower portion of the third module 110 and is disposed below the third module hood 102 and the substrate 250. A third module process volume 304 is disposed between the third module hood 102 and the substrate 250 when the substrate is sealed to the transfer device 150 and the bottom surface 380 of the third module hood 102 is sealed to the top surface 212 of the transfer device 150 as shown in FIG. 3B. In operation, the cooling pedestal 384 is raised through the pedestal openings to contact the substrate 250 in order to cool the substrate 250.

The third module hood 102 includes a third module body 328 coupled to a shaft 330. The third module body 328 includes the bottom surface 380 of the sidewalls. The third module body 328 is coupled to a third hood actuator 376. The third hood actuator 376 is configured to raise and lower the third module hood 102 to enable the transfer device 150 to transfer the substrate 250 into the third module process volume 304 and below the third module body 328.

The cooling pedestal 384 is configured to be raised through the pedestal openings to contact the bottom surface 216 of the substrate 250. The cooling pedestal 384 includes a cooling substrate support surface on the top of the cooling pedestal 384. The cooling pedestal 384 is coupled to a cooling pedestal shaft 386. The cooling pedestal shaft 386 is disposed through the bottom wall of the unit body 140. The cooling pedestal 384 is grounded. The cooling pedestal 384 is further coupled to a cooling pedestal actuator 322. The cooling pedestal actuator 322 is configured to raise and lower the cooling pedestal 384 through the pedestal openings. In some embodiments, the cooling pedestal actuator 322 and the heating pedestal actuator 320 are connected, such that when one of the cooling pedestal 384 or the heating pedestal 348 are moved, the other of the cooling pedestal 384 or the heating pedestal 348 is moved simultaneously and the same amount.

The cooling pedestal 384 is a highly conductive material, with an electrical resistivity of less than about $1 \times 10^{-3}$ Ω·m, such as less than $1 \times 10^{-4}$ Ω·m, such as less than $1 \times 10^{-5}$ Ω·m. The contact resistance between the cooling pedestal 384 and the substrate 250 has a greater impact on the ability of the cooling pedestal 384 to electrically ground the substrate 250 than the resistivity of the cooling pedestal 384 itself. In embodiments described herein, the contact resistance between the cooling pedestal 384 and the substrate 250 is less than about $1 \times 10^{-3}$Ω, such as less than about $1 \times 10^{-3}$Ω. In some embodiments, the cooling pedestal 384 is an aluminum, a doped silicon carbide, or a dopes silicon material. The cooling pedestal 384 includes one or more cooling elements 332. The one or more cooling elements 332 disposed through the body of the cooling pedestal 384 are cooling fluid conduits. The cooling fluid conduits are cooling popes disposed through the pedestal. The one or more cooling elements 332 are coupled to a coolant source 324 by a coolant supply line. The coolant source 324 may supply water or another coolant fluid to the cooling pedestal 384.

As shown in FIG. 3A, the heating pedestal 348 and the cooling pedestal 384 are disposed in a processing position, while the second module hood 104 and the third module hood 102 are in a transfer position. As shown in FIG. 3B, the heating pedestal 348 and the cooling pedestal 384 are disposed in a processing position, while the second module hood 104 and the third module hood 102 are also disposed in a processing position. While in the processing position, one or both of the second module process volume 302 and the third module process volume 304 are sealed. Sealing the second module process volume 302 enables a process fluid to fill the second module process volume 302 to form the second module process 352. The process fluid submerges the substrate 250, the electrode 350, the spacer 315 and the monitor electrode 314. While each of the heating pedestal 348 and the second module hood 104 are disposed in the processing position, a first height $H_1$ separates the bottom surface of the electrode 350 and the top surface of the substrate 250. The first height $H_1$ is less than about 7 mm, such as less than about 5 mm, such as less than about 4 mm, such as about 1 mm to about 4 mm. The first height $H_1$ is smaller to improve the uniformity of the electric field applied to the substrate 250. Apparatus described herein enable smaller distances between the electrode and the substrate as the location and size of the fluid inlets 306 does not limit the distance between the two surfaces.

Although not shown herein, one or more gas inlets may be in fluid communication with the third module process volume 304. The one or more gas inlets may be configured to supply an inert gas to the third module process volume 304 during cooling of the substrate 250.

Figure 3C:
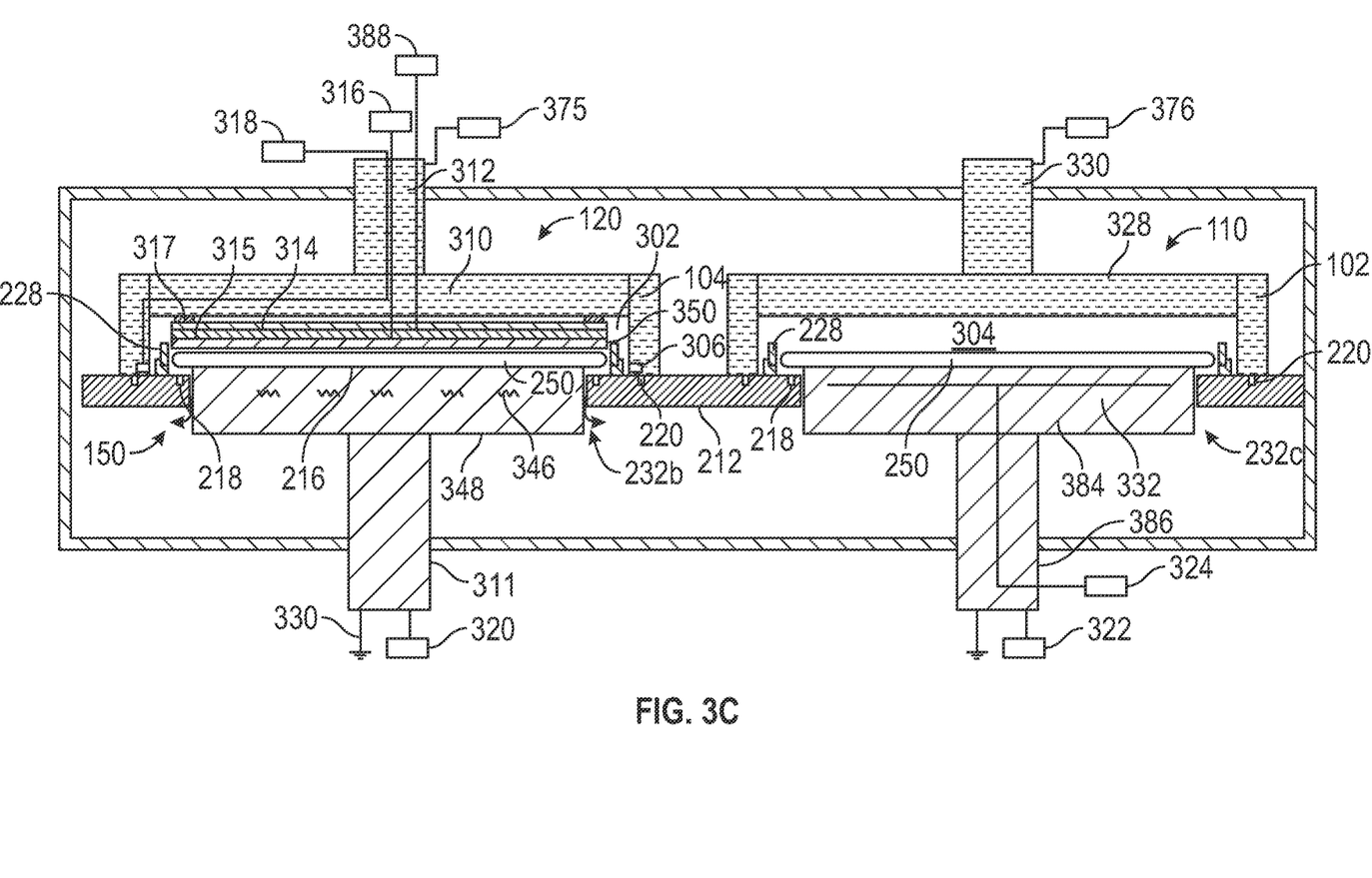
Figure 3D:
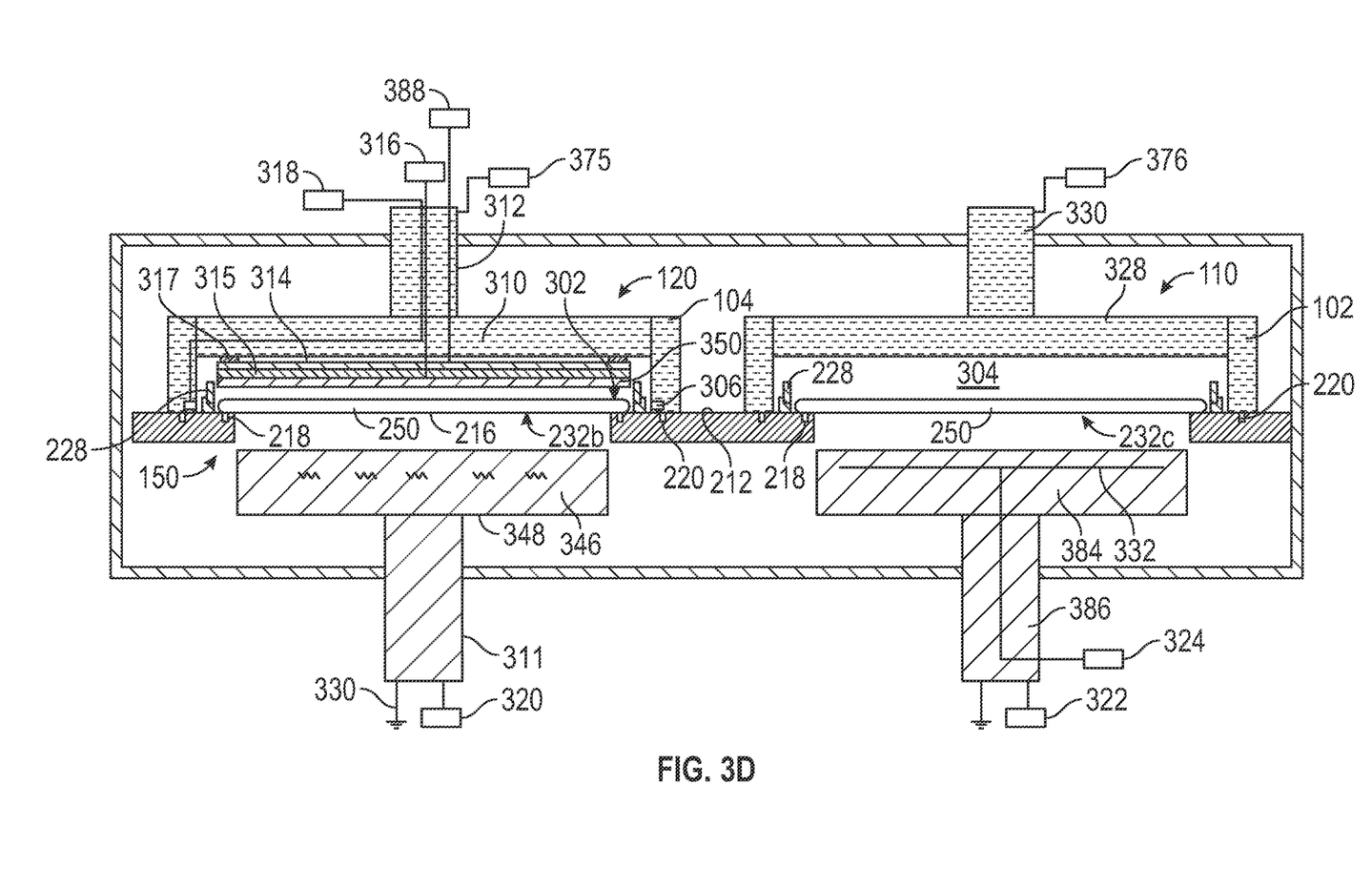

As shown in FIG. 3C, the heating pedestal 348 and the cooling pedestal 384 are disposed in a drain position. The drain position enables fluid to be drained from the second module process volume 302 without the use of additional pumps and conduits. While in the drain position, the heating pedestal 348 and the cooling pedestal 384 are moved upwards from the process position by less than about 7 mm, such as less than about 5 mm, such as less than about 4 mm, such as about 1 mm to about 4 mm. The drain position raises the substrates 250, while not contacting the substrate 250 with the electrode 350. The one or more clamps 228 are also shown in an open position, as the substrates 250 are released from the clamps 228 before being moved to the drain position. After draining the process fluid, the heating pedestal 348 and the cooling pedestal 384 are lowered to a transfer position as shown in FIG. 3D. While in the transfer position, the heating pedestal 348 and the cooling pedestal 384 are separated from the substrates 250 and below the transfer device 150.

Figure 4:
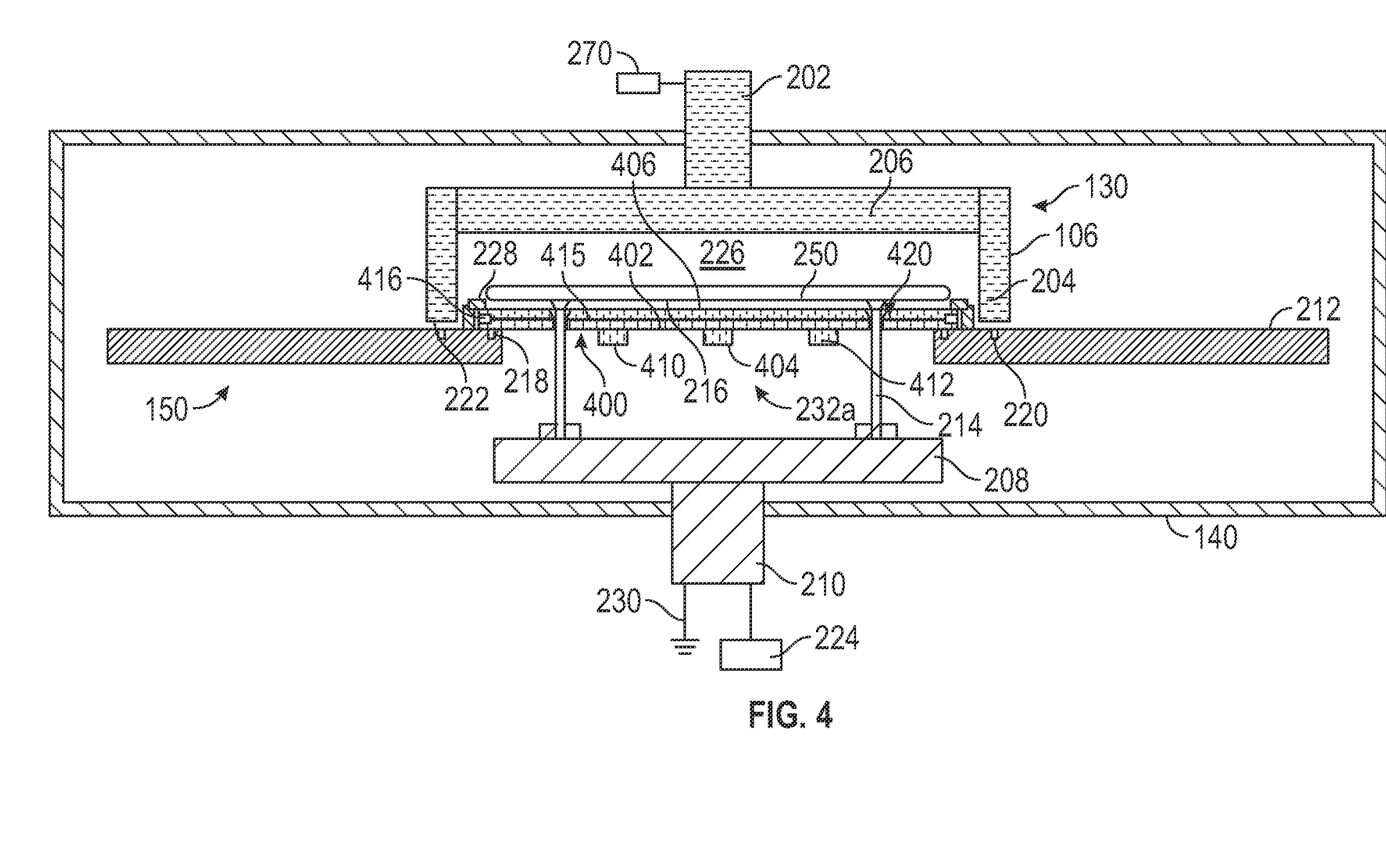
FIG. 4 is a schematic cross-sectional view of the first module of the immersion lithography carousel assembly of FIG. 1 according to another embodiment described herein.

FIG. 4 is a schematic cross-sectional view of the first module 130 of the immersion lithography carousel assembly 100 of FIG. 1 according to another embodiment described herein. The first module 130 of FIG. 4 is different from the first module 130 of FIG. 2 in that in FIG. 4, the substrate 250 is disposed on top of a separable substrate support 400. The separable substrate support 400 is configured to be disposed on the transfer device 150 and moved between each of the first module 130, the second module 120, and the third module 110 along with a substrate 250, which is disposed thereon. The use of the separable substrate support 400 reduces the damage done to the backside of the substrate 250 by minimizing the number of times the separable substrate support 400 is contacted. The use of the separable substrate support 400 additionally provides for power or fluid to be delivered through the pedestals and to the separable substrate support 400. In some embodiments, the separable substrate support 400 is described as a carrier and may be utilized to transport the substrate between different module locations.

The separable substrate support 400 includes a separable support body with a top surface 406 and a bottom surface 402. The top surface 406 is configured to receive the substrate 250. The top surface 406 is a planar surface with a diameter of greater than about 200 mm, such as greater than about 300 mm. The bottom surface 402 is configured to couple to the top surface 212 of the transfer device 150. The bottom surface 402 further includes a first connection 410, a second connection 412, and a third connection 404. Each of the first connection 410, the second connection 412, and the third connection 404 are configured to couple one or more power sources, fluid sources, or gas sources thereto. The second connection 412 is coupled to a fluid distribution channel 415 within the body of the separable substrate support 400 and one or more support fluid inlets 416 disposed around the circumference of the separable substrate support 400.

Another difference between the first module 130 of FIG. 1 and the first module 130 as described with respect to FIG. 4 is the location of the lift pins 214 during processing. In the embodiments of FIGS. 1 and 2A-2D, the lift pins 214 stayed within the first module 130. However, in embodiments such as those in FIG. 4, the lift pins 214 are transferred between the first module 130, the second module 120, and the third module 110. This is because the lift pins 214 are disposed within the separable substrate support 400 within separable support pin holes 420. Additionally, a sealing ring, such as an o-ring, is disposed in the inner sealing groove 218 and configured to form a seal with a bottom surface 402 of the separable substrate support 400 rather than the bottom surface 216 of the substrate 250 in the embodiments of FIGS. 4 and 5. The one or more clamps 228 are also adjusted to clamp the separable substrate support 400. The one or more clamps 228 are configured to clamp the top surface 406 of the separable substrate support 400 as disclosed herein, but in some embodiments, may couple either the edge or the bottom of the separable substrate support 400.

Figure 5:
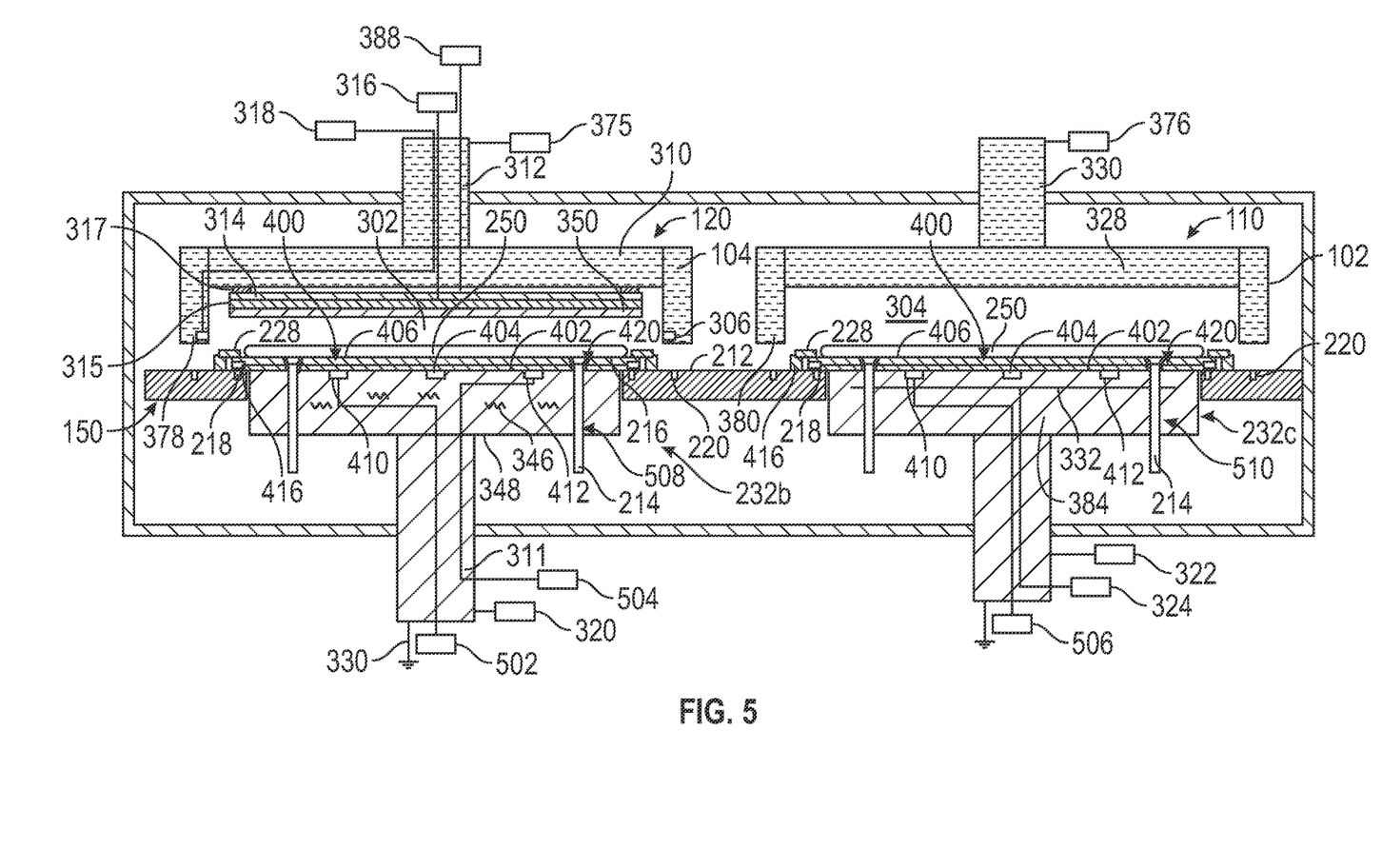
FIG. 5 is a schematic cross-sectional view of a second module and a third module of the immersion lithography carousel assembly of FIG. 1 according to another embodiment described herein.

FIG. 5 is a schematic cross-sectional view of a second module 120 and a third module 110 of the immersion lithography carousel assembly 100 of FIG. 1 according to another embodiment described herein. FIG. 5 illustrates the second module 120 and the third module 110 when the separable substrate support 400 is integrated therein. The difference between the second module 120 and the third module 110 of FIG. 5 compared to the second module 120 and the third module 110 of FIGS. 2A-2D is that the heating pedestal 348 and the cooling pedestal 384 are configured to couple to the separable substrate support 400. This includes one or more connectors for coupling the top surface of the second module 120 and the third module 110 to the bottom surface 402 of the separable substrate support 400.

The heating pedestal 348 of FIG. 5 includes a plurality of lift pin holes 508 disposed therethrough. The plurality of lift pin holes 508 allow the lift pins 214 to pass therethrough. The lift pins 214 are the same lift pins as in the first module 130 and have been moved between the first module 130 and the second module 120 along with the substrate 250 and the separable substrate support 400. The heating pedestal 348 is further configured to mechanically couple to the bottom surface 402 of the separable substrate support 400 at the third connection 404. The third connection 404 is a mechanical connection, such as a protrusion inserted into an opening or a clamp coupling the separable substrate support 400 to the heating pedestal 348.

A process fluid line is disposed through the heating pedestal 348 to fluidly couple a pedestal process fluid source 504 with the second connection 412, which fluidly couples the pedestal process fluid source 504 to the second module process volume 302 via the support fluid inlets 416. The first connection 410 is electrically connected to a heating pedestal power source 502. The heating pedestal power source 502 is configured to either chuck the substrate 250 to the top surface 406 of the separable substrate support 400 or to power one or more heating devices within the separable substrate support 400. In some embodiments, the heating pedestal power source 502 is not utilized. In some embodiments, a vacuum pump, which is fluidly connected to the first connection 410 via a gas line, is utilized to vacuum chuck the substrate 250 to the separable substrate support 400 during processing.

The cooling pedestal 384 of FIG. 5 includes a plurality of lift pin holes 510 disposed therethrough. The plurality of lift pin holes 510 are disposed through the cooling pedestal 384 to allow the lift pins 214 to pass. The lift pins 214 are the same lift pins as in the first module 130 and have been moved between the second module 120 and the third module 110 along with the substrate 250 and the separable substrate support 400. The cooling pedestal 384 is further configured to mechanically couple to the bottom surface 402 of the separable substrate support 400 at the third connection 404. The third connection 404 is a mechanical connection, such as a protrusion inserted into an opening or a clamp coupling the separable substrate support 400 to the heating pedestal 348.

Similar to the heating pedestal power source 502, the first connection 410 of another separable substrate support 400 is electrically connected to a cooling pedestal power source 506. The cooling pedestal power source 506 is configured to chuck the substrate 250 to the top surface 406 of the separable substrate support 400 using an electrostatic chuck. In some embodiments, the cooling pedestal power source 506 is not utilized. In yet other embodiments, the cooling pedestal power source 506 is replaced by a vacuum pump, which is fluidly connected to the first connection 410 via a gas line. The vacuum pump assists in vacuum chucking the substrate 250 to the separable substrate support 400 during cooling.

Figure 6:
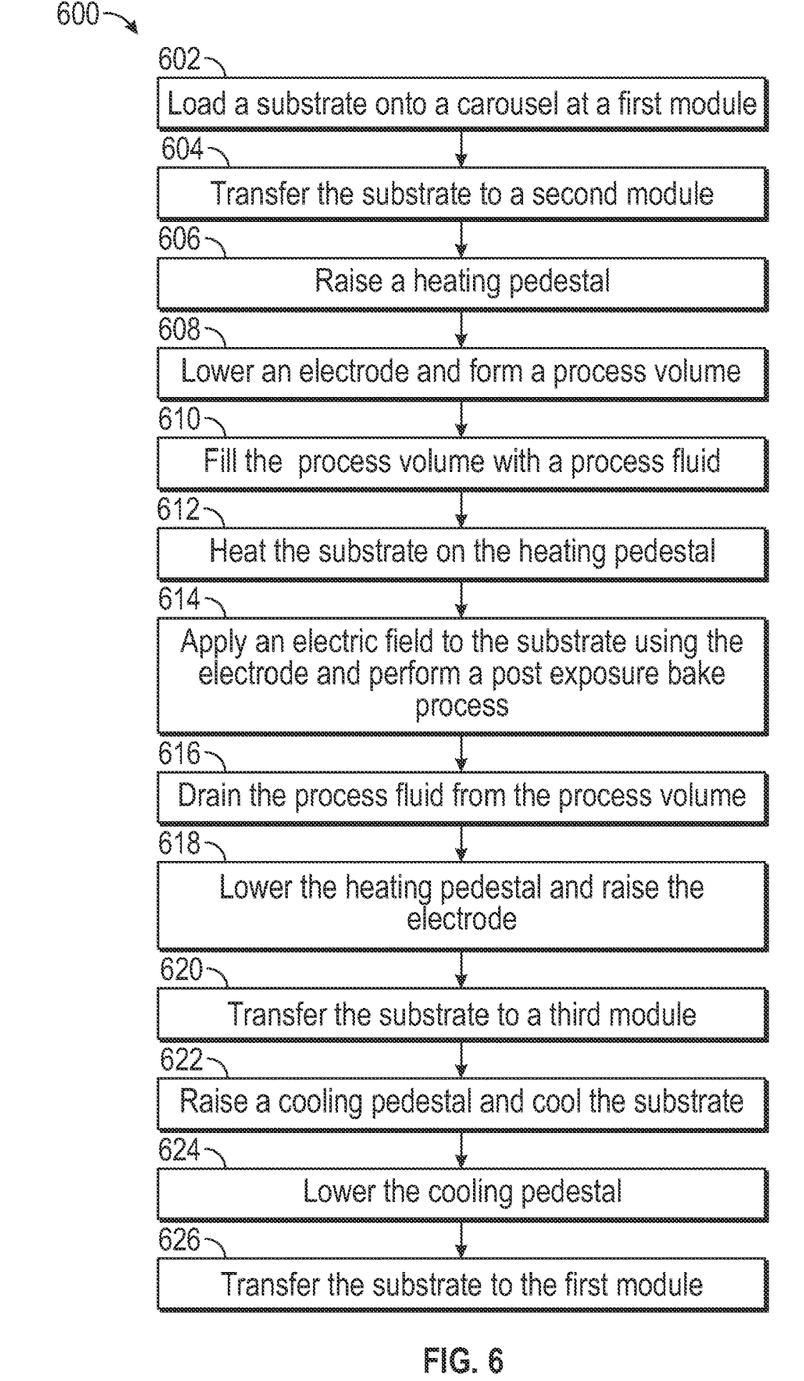
FIG. 6 illustrates operations of a method for performing an immersion post exposure bake process according to an embodiment described herein.

FIG. 6 illustrates operations of a method 600 for performing an immersion post exposure bake process. The method 600 can be performed utilizing apparatus similar to the apparatus of FIGS. 1, 2, 3A-3D, 4, and 5, among others. The method 600 includes a first operation 602 of loading a substrate, such as the substrate 250 onto a carousel, such as the transfer device 150, at a first station, such as the first module 130. The substrate is loaded onto the carousel while a first module hood, such as the first module hood 106, and a lift assembly, such as the lift assembly 208, are in transfer positions. The transfer position of the first module hood is a raised position, wherein the first module hood is not contacting the carousel. The transfer position of the lift assembly 208 is a raised position, wherein the tops of a plurality of lift pins, such as the lift pins 214, are disposed above a top surface of the carousel. While in this position, a substrate is transferred into a unit body, such as the unit body 140, through a substrate transfer passage, such as the substrate transfer passage 108, and onto the lift pins in the first module. The substrate is then lowered by lowering the lift assembly and the lift pins, so that the substrate is placed on top of the carousel. After placing the substrate onto the carousel, the substrate may be clamped to the carousel by one or more clamps, such as the clamps 228. Clamping the substrate to the carousel reduces sliding of the substrate during transfer between modules.

After the first operation 602, the substrate is transferred to a second module, such as the second module 120, during a second operation 604. Transferring the substrate to the second module includes rotating the carousel about a central axis A. The substrate may be actuated about 120 degrees around the central axis A to the second module. After the second operation 604, a heating pedestal, such as the heating pedestal 348, is raised during a third operation 606. The heating pedestal is raised to a processing position during the third operation 606, such that the top surface of the heating pedestal 348 contacts the bottom surface of the substrate 250, while the substrate is clamped onto the carousel as shown in FIG. 3A.

A fourth operation 608 of lowering an electrode, such as the electrode 350, and forming a process volume, such as the second module process volume 352 is performed either before, during, or after the third operation 606. The electrode is lowered to be closer to the substrate. The electrode is lowered by lowering a second module hood, such as the second module hood 104. Lowering the second module hood additionally forms a sealed second module process volume by forming a seal between the second module hood and the carousel. While in the lowered position, the electrode and the second module hood are said to be in a processing position.

After the fourth operation 608, the second module process volume is filled with a process fluid during a fifth operation 610. The process fluid is flowed into the second module process volume by one or more fluid inlets, such as the fluid inlets 306 and/or the support fluid inlets 416. The process fluid is flowed into the second module process volume until the substrate and the electrode are completely submerged.

After the fifth operation 610, the substrate is heated by the heating pedestal during a sixth operation 612. Heating the substrate includes applying power to one or more heating elements, such as the heating elements 346. The heating elements raise the temperature of the substrate to a temperature of about 80° C. to about 250° C., such as about 90° C. to about 230° C., such as about 90° C. to about 130° C.

Either simultaneously with or subsequent to the sixth operation 612, an electric field is applied to the substrate using the electrode during a seventh operation 614. Applying the electric field assists in performing a post-exposure bake operation on the substrate. The electric field is applied by applying an electric potential of up to 5000 V to the electrode by an electrode power source, such as less than 4000 V, such as less than 3000 V. In embodiments described herein, the reduced distance between the substrate and the electrode enabled by the apparatus herein greatly reduces the electric potential used for processing of the substrate. In some embodiments, an electric potential of less than 5000 V is applied to the electrode, such as less than 4000 V, such as less than 3000 V, such as less than 1000 V. Larger distances between the electrode and the substrate use larger electrical potentials to overcome voltage drop across the gap between the electrode and the substrate. An electric field between the electrode and the substrate is less than about $1 \times 10^7$ V/m, such as less than $1 \times 10^6$ V/m, such as less than $1 \times 10^5$ V/m. In some embodiments, the electric field is between about $10 \times 10^6$ V/m and about $1 \times 10^4$ V/m. The electric field may be about $1 \times 10^5$ V/m to about $1 \times 10^7$ V/m, such as about $1 \times 10^5$ V/m to about $1 \times 10^6$ V/m. The strength of the electric field is limited by the breakdown voltage of the medium disposed within the process volume. In some embodiments, the breakdown voltage of the fluid disposed within the process volume is about $1.4 \times 10^7$ V/m. The electric field is applied to the substrate until the post exposure bake operation is complete.

After the seventh operation 614, the process fluid is drained from the second module process volume during an eighth operation 616. Draining the process fluid includes moving the heating pedestal to a draining position. In the draining position, the heating pedestal is positioned above the process position by less than about 7 mm, such as less than about 5 mm, such as less than about 4 mm, such as about 1 mm to about 4 mm. The heating pedestal in the drain position raises the substrates, while not contacting the substrate with the electrode. The one or more clamps are also opened to release the substrate from the clamps before moving the substrate disposed on the heating pedestal to the draining position. The process fluid drains around the heating pedestal through the gap between the heating pedestal and the pedestal openings disposed through the carousel.

After draining the process fluid during the eighth operation 616, the heating pedestal is lowered to a transfer position as shown in FIG. 3D and the second module hood (along with the electrode) is raised to the transfer position during a ninth operation 618. While in the transfer position, the heating pedestal is separated from the substrate and below the carousel. The second module hood and the electrode are raised so that the seal between the second module hood and the carousel is broken. Once both the heating pedestal and the second module hood are in a transfer position, the substrate is transferred to a third module, such as the third module 110 by the carousel during a tenth operation 620. During the tenth operation 620, the carousel is rotated about the central axis A until the substrate is disposed above a cooling pedestal, such as the cooling pedestal 384. The substrate is rotated about 120 degrees on the carousel from the position within the second module to the position in the third module.

After the tenth operation 620, the cooling pedestal is raised to contact the bottom surface of the substrate and the substrate is cooled during an eleventh operation 622. During the eleventh operation 622, the cooling pedestal is cooled by one or more cooling elements, such as the cooling elements 332. The cooling pedestal subsequently cools the substrate through contact. During this operation, one or more gases may also be flowed into a third module process volume, such as the third module process volume 304 after the third module hood 102 is lowered to form a sealed third module process volume 304 in a similar manner to how the second module process volume 302 is sealed. The process gases may be used to enhance the cooling of the substrate or to remove byproducts on the substrate. The cooling pedestal cools the substrate to a temperature of less than about 40° C., such as less than about 35° C., such as less than about 32° C.

After the eleventh operation 622, the cooling pedestal is lowered back to a transfer position during a twelfth operation 624. The cooling pedestal is lowered to be below the carousel. The third module hood 102 is raised to a transfer position after the eleventh operation 622. One the cooling pedestal is lowered and the third module hood is raised, the substrate is transferred back to the first module by the carousel during a thirteenth operation 626. After the substrate is transferred back to the first module, the substrate may either rest or be removed from the carousel through the substrate transfer passage.

Embodiments described herein are beneficial in that substrates may be processed horizontally, while reducing bubbling effects on the post exposure bake process. Embodiments described herein also allow for the electrodes and substrate to be disposed closer together during processing, which reduces the impact of electric field non-uniformities. The use of the transfer device with a plurality of openings for the pedestals further enables a plurality of substrates to be processed at a time with shared apparatus. Processing multiple substrates simultaneously increases throughput of the system and decreases cost of ownership.

While the foregoing is directed to embodiments of the present disclosure, other and further embodiments of the disclosure may be devised without departing from the basic scope thereof, and the scope thereof is determined by the claims that follow.

What is claimed is:

1. An immersion lithography carousel assembly, comprising:
   a first module comprising:
      a lift surface; and
      a plurality of lift pins;
   a second module comprising:
      a heating pedestal;
      a second module hood forming a second module process volume between the heating pedestal and the second module hood; and
      an electrode;
   a third module comprising:
      a cooling pedestal; and
      a third module hood forming a third module process volume between the cooling pedestal and the third module hood; and
   a transfer device comprising a plurality of openings, the transfer device rotatable to position a first opening selectively over the lift surface, the heating pedestal, and the cooling pedestal.

2. The immersion lithography carousel assembly of claim 1, wherein the heating pedestal comprises a plurality of heating elements disposed therein, the heating pedestal operable to at least partially pass through the first opening.

3. The immersion lithography carousel assembly of claim 2, wherein the cooling pedestal comprises one or more cooling elements disposed therein, the cooling pedestal operable to at least partially pass through the first opening.

4. The immersion lithography carousel assembly of claim 1, wherein the plurality of openings comprise three openings evenly spaced about a central axis.

5. The immersion lithography carousel assembly of claim 1, wherein the electrode has an electrical resistivity of less than about $5 \times 10^{-4}$ $\Omega \cdot m$.

6. The immersion lithography carousel assembly of claim 1, wherein the heating pedestal has an electrical resistivity of less than about $5 \times 10^{-4}$ $\Omega \cdot m$.

7. The immersion lithography carousel assembly of claim 1, wherein the second module hood has an electrical resistivity of greater than about $10 \times 10^{19}$ $\Omega \cdot m$.

8. The immersion lithography carousel assembly of claim 1, wherein the second module further comprises:
   a monitor electrode disposed above the electrode; and
   a ceramic spacer disposed between the monitor electrode and the electrode.

9. The immersion lithography carousel assembly of claim 1, wherein a process fluid inlet is in fluid communication with the second module process volume.

10. An immersion lithography carousel assembly, comprising:
    a first module comprising:
       a lift surface; and
       a plurality of lift pins holders;
    a second module comprising:
       a heating pedestal;
       a second module hood forming a second module process volume between the heating pedestal and the second module hood; and
       an electrode coupled to the second module hood;

a third module comprising:
  a cooling pedestal; and
  a third module hood forming a third module process volume between the cooling pedestal and the third module hood; and
a carousel assembly with a plurality of pedestal openings disposed therethrough, each of the plurality of pedestal openings configured to actuate over each of the lift surface, the heating pedestal, and the cooling pedestal and each of the heating pedestal and the cooling pedestal operable to at least partially pass through the plurality of pedestal openings.

11. The immersion lithography carousel assembly of claim 10, further comprising a process fluid inlet disposed through the second module hood and in fluid communication with the second module process volume.

12. The immersion lithography carousel assembly of claim 10, further comprising a process fluid inlet disposed through the cooling pedestal and in fluid communication with the second module process volume.

13. The immersion lithography carousel assembly of claim 12, further comprising a separable substrate support configured to be disposed on the carousel assembly and move between each of the first module, the second module, and the third module.

14. The immersion lithography carousel assembly of claim 10, further comprising an o-ring gland disposed around each of the pedestal openings of the plurality of pedestal openings.

15. The immersion lithography carousel assembly of claim 10, further comprising:
  a heating pedestal actuator coupled to the heating pedestal and configured to raise and lower the heating pedestal; and
  a cooling pedestal actuator coupled to the cooling pedestal and configured to raise and lower the cooling pedestal.

16. The immersion lithography carousel assembly of claim 10, wherein the second module further comprises:
  a monitor electrode disposed above the electrode; and
  a ceramic spacer disposed between the monitor electrode and the electrode.

17. The immersion lithography carousel assembly of claim 10, wherein the electrode is a perforated electrode or an electrode mesh.

18. A method of performing a post-exposure bake process comprising:
  loading a substrate onto a carousel at a first station;
  transferring the substrate from the first station to a second station on the carousel;
  raising a heating pedestal of the second station to contact a backside of the substrate at a process position;
  heating the substrate using the heating pedestal after raising the heating pedestal;
  filling a second module process volume with a process fluid, wherein the second module process volume is disposed between the heating pedestal and a hood of an electrode assembly;
  applying an electric field to the substrate using an electrode disposed within the electrode assembly after filling the second module process volume with the process fluid;
  lowering the heating pedestal to a transfer position;
  transferring the substrate from the second station to a third station on the carousel;
  raising a cooling pedestal of the third station to contact a backside of the substrate at a cooling position;
  cooling the substrate using the cooling pedestal; and
  lowering the cooling pedestal to the transfer position.

19. The method of performing the post-exposure bake process of claim 18, wherein the electric field has a strength of less than about $10 \times 10^6$ V/m.

20. The method of performing the post-exposure bake process of claim 18, further comprising:
  raising the substrate off of the carousel using the heating pedestal after applying the electric field and draining the process fluid from the second module process volume; and
  lowering the substrate onto the carousel after raising the substrate off of the carousel using the heating pedestal.

* * * * *